(12) United States Patent
Mund et al.

(10) Patent No.: US 7,396,741 B2
(45) Date of Patent: Jul. 8, 2008

(54) METHOD FOR CONNECTING SUBSTRATE AND COMPOSITE ELEMENT

(75) Inventors: Dietrich Mund, Obersüssbach (DE); Jürgen Leib, Freising (DE)

(73) Assignee: Schott AG, Mainz (DE)

( * ) Notice: Subject to any disclaimer, the term of this patent is extended or adjusted under 35 U.S.C. 154(b) by 247 days.

(21) Appl. No.: 10/511,557

(22) PCT Filed: Apr. 15, 2003

(86) PCT No.: PCT/EP03/03907

§ 371 (c)(1),
(2), (4) Date: May 26, 2005

(87) PCT Pub. No.: WO03/088347

PCT Pub. Date: Oct. 23, 2003

(65) Prior Publication Data

US 2006/0030074 A1    Feb. 9, 2006

(30) Foreign Application Priority Data

| Apr. 15, 2002 | (DE) | 202 05 830 U |
| May 23, 2002 | (DE) | 102 22 609 |
| May 23, 2002 | (DE) | 102 22 958 |
| May 23, 2002 | (DE) | 102 22 964 |
| Nov. 13, 2002 | (DE) | 102 52 787 |
| Jan. 16, 2003 | (DE) | 103 01 559 |

(51) Int. Cl.
*H01L 21/50* (2006.01)
*H01L 23/10* (2006.01)

(52) U.S. Cl. ............... 438/456; 257/730; 257/E23.127

(58) Field of Classification Search .............. 438/456, 438/458; 257/E23.127, 678, 686, 723, 730
See application file for complete search history.

(56) References Cited

U.S. PATENT DOCUMENTS 4,426,768 A * 1/1984 Black et al. ............... 438/51
4,802,952 A * 2/1989 Kobori et al. ............ 438/51

(Continued)

FOREIGN PATENT DOCUMENTS

DE    10222609.1 A1    5/2002

(Continued)

OTHER PUBLICATIONS

XP-10232226A-1, Anodic Bonding Technique Under Low-Temperature and Low-Voltage Using Evaporated Glass, Woo-Beom Choi et al., 9th Int'l Vacuum Microelectronics Conference, St. Petersburg 1996, pp. 427-430.

(Continued)

*Primary Examiner*—M. Wilczewski
(74) *Attorney, Agent, or Firm*—Ohlandt, Greeley, Ruggiero & Perle, L.L.P.

(57) ABSTRACT

A process for joining substrates having electrical, semiconducting, mechanical and/or optical components, and to a composite element is provided. The process is to be suitable for substrates that are to be joined substantially irrespective of material and for sensitive substrates. According to the process, a raised frame, in particular formed from anodically bondable glass, is applied by evaporation coating to one of the two substrates in order to serve as a joining element.

19 Claims, 12 Drawing Sheets

U.S. PATENT DOCUMENTS

| | | | | |
|---|---|---|---|---|
| 5,343,064 A | * | 8/1994 | Spangler et al. | 257/350 |
| 5,895,233 A | | 4/1999 | Higashi et al. | 438/107 |
| 6,969,667 B2 | * | 11/2005 | Liebeskind et al. | 438/455 |

FOREIGN PATENT DOCUMENTS

| | | |
|---|---|---|
| DE | 10222958.9 A1 | 5/2002 |
| DE | 10222964.3 A1 | 5/2002 |
| DE | 10252787.3 A1 | 11/2002 |
| DE | 10301559.0 A1 | 10/2003 |
| EP | 0 280 905 A2 | 9/1988 |

OTHER PUBLICATIONS

International Preliminary Examination Report dated May 6, 2005.

* cited by examiner

METHOD FOR CONNECTING SUBSTRATE AND COMPOSITE ELEMENT

BACKGROUND OF THE INVENTION

1. Field of the Invention

The invention relates to a process for joining substrates in general and for joining substrates having electrical, semiconducting, mechanical and/or optical components and to a composite element, in particular.

2. Description of Related Art

Joining techniques are used for a wide range of technical fields. By way of example, at this point reference may be made of the formation of housings for electronic components by means of which, for example, electronic circuits are enclosed.

For example, there are known processes in which components or integrated circuits on a semiconductor chip or still joined to a semiconductor wafer are provided with a housing and with electrical connection contacts. If the mounting of the chip or the integrated circuit and the joining of contact regions of the chip to the housing contacts which lead to the outside are carried out while it is still joined to the wafer, a mounting method of this type is generally referred to as a wafer level packaging process. It is also known to encapsulate individual chips or dies, known as single die packaging.

These processes are used to adhesively bond components, for example, using epoxy resins. However, a drawback of adhesive bonding is a low chemical resistance, poor optical properties and the risk of components being soiled with adhesive. Furthermore, adhesion locations are subject to an aging process which is accompanied by a deterioration in the quality of the join.

The fundamentally known joining techniques or processes also include what is known as bonding. A particular type of bonding is what is known as anodic bonding, in which a voltage is applied to an interface under the action of heat, which forces charge carrier diffusion.

Although bonding processes have a number of advantages over epoxy adhesive joining, their application is very restricted, making them inflexible.

By way of example, anodic bonding is disadvantageously restricted to a very tightly limited number of materials, since the charge carriers have to be provided in the material. For example, anodic bonding typically requires materials which contain alkaline metals. Therefore, anodic bonding is not suitable for a wide range of applications. The same is also true of other bonding processes.

Furthermore, bonding processes do not involve any build-up and consequently, they have hitherto only been suitable for plane-parallel connections. This too considerably restricts the range of applications.

Document EP 0 280 905 describes a process for producing pressure sensors in which a borosilicate glass layer is formed on a silicon wafer. The glass layer is described as a matrix which covers the corresponding sensor chips and a conductive layer. However, the borosilicate glass layer is formed by sputtering on the surface of the silicon sensor wafer. It is fundamentally difficult and expensive to produce relatively great layer thicknesses by sputtering. Although a layer thickness of 5 µm is mentioned, when using the sputtering process this is typically associated with considerable heating of the substrate, which can cause further difficulties.

Document U.S. Pat. No. 5,825,233 describes a microhousing for infrared chips, in which a layer of soldering agent is applied by vacuum deposition and lift-off technique or etching or by a mask. However, a soldering agent brings with it the risk of contamination.

The document "Anodic Bonding Technique under Low-temperature and Low-voltage using Evaporated Glass" by Woo-Beom Choi, 9th International Vacuum Microelectronics Conference, St. Petersburg, 1996 describes a process in which a glass layer is applied to a silicon wafer by electron beam evaporation. However, the application of this process is limited.

In any event, there is still a considerable need for versatile and improved joining processes.

BRIEF SUMMARY OF THE INVENTION

Therefore, the invention is based on the object of providing a joining process which is inexpensive and versatile to use and in particular works quickly and efficiently.

A further object of the invention is to provide a joining process which is substantially independent of the type of material used in the components or substrates to be joined and in particular is also suitable for sensitive substrates.

Yet another object of the invention is to provide a joining process which has a high chemical and/or physical stability of the join and ensures a permanently sealed join.

Yet another object of the invention is to provide a joining process which allows the production of cavities or voids.

Yet a further object of the invention is to provide a joining process which is suitable not only for electrical and electronic components but also for optical, electro-optical, electromechanical and/or opto-electro-mechanical systems.

The object of the invention is achieved in a surprisingly simple way by the subject matter of the independent claims. Advantageous refinements of the invention are defined in the subclaims.

The invention proposes a process for joining at least two substrates, in particular having electrical, semiconducting, mechanical and/or optical components.

The substrates are preferably made from a material or material composites which comprise(s) glass, ceramic or semiconductor materials, in particular silicon, III-V, such as GaAs or GaAl$_x$As$_{1-x}$ (VCSELS), II-VI InP (LEDs), and also other organic or inorganic materials, such as for example metals, e.g. Kovar.

In particular, after a first substrate has been provided, a joining element is produced by means of structuring on a first surface of the first substrate or is applied to the first surface of the first substrate. The second substrate may likewise be structured or alternatively may be unstructured.

Then, after a second substrate has been provided, the first and second substrates are joined by means of the joining element. In particular, a surface of the second substrate is joined to a surface of the joining element, either temporarily, e.g. to offer protection during further processing steps or permanently. In this way, a composite element, e.g. a hermetically encapsulated or housed chip or die can be produced in a very simple way using either single die technology or as part of wafer level packaging.

In the case of wafer level packaging, the first and second substrates are realized by a first and a second wafer, respectively. A frame is applied by evaporation coating to the first surface of the first wafer around each semiconductor region or subsequent chip, so as to produce a multiplicity of laterally adjacent and/or laterally spaced-apart frames. After the two wafers have been joined to form a wafer assembly, the latter is diced, in particular by sawing, between the frames to produce individual chips. Advantageously, therefore, a large number of chips are housed simultaneously in a single working step.

The housing is particularly suitable for electronic components, especially for semiconductor, optical and/or micromechanical systems.

The ranges of possible applications are extremely diverse; by way of example, the process according to the invention is suitable in particular for the encapsulation of micro-electromechanical systems (MEMS), micro-optical systems (MOMS), micro-electromechanical-optical systems (MOEMS) or conventional semiconductor regions or elements on one of the two substrates to be joined. In this application, the joining element forms, an optionally temporary stop for micromechanical components, such as for example microswitches, or micro-mirrors.

The joining element is preferably a frame or bonding frame which is deposited on the first surface of one of the two substrates and is permanently and fixedly joined to the first substrate during deposition. The frame is raised with respect to the first surface of the substrate by its layer thickness and provides a suitable bonding surface.

The frame provides, completely or at least in part, the bonding surface for one or more further substrates, in particular if the frame is applied by means of a multi-stage structuring process.

It has proven particularly advantageous for a frame to be deposited or evaporation-coated onto the first surface from a binary system of materials, in particular glass or from a vitreous material. The glass used is in particular a silicate or borosilicate glass, e.g. the evaporation-coating glass 8329 and/or G018-189 produced by SCHOTT Glas. One advantage of this evaporation-coating or deposition process is the application of the insulating glass layer at room temperature up to approximately 150° C., so that there is no likelihood of damage or oxidation to the substrate surface even in the case of metal substrates. In this context, reference is also made to applications DE 202 05 830.1, filed on Apr. 15, 2002;
DE 102 22 964.3, filed on May 23, 2002;
DE 102 22.609.1, filed on May 23, 2002;
DE 102 22 658.9, filed on May 23, 2002;
DE 102 52 787.3, filed on Nov. 13, 2002;
DE 103 01 559.0, filed on Jan. 16, 2003 in the name of the same Applicant, the content of disclosure of which is hereby expressly incorporated by reference.

Therefore, it is preferable for the joining element or frame used to be a structured glass layer which is, for example, applied by evaporation coating and structured through a mask. Photolithographic processes, for example using a photoresist, in particular what is known as the lift-off technique, which is fundamentally known to the person skilled in the art, have proven suitable for the structuring.

However, it is also possible to use masks which, for example, are adhesively joined to the substrate or are arranged between target and substrate during the evaporation coating.

The joining element according to the invention, in particular the glass layer which has been applied by evaporation coating as a frame in this manner has a large number of advantages.

Firstly, glass has excellent properties in terms of stability, hermetic sealing and chemical resistance, in particular to solvents, acids and alkalis. These properties correspond to those of a borosilicate glass.

The lateral position of the joining element is very accurate, in particular if photolithographic structuring methods are used.

The joining element can be applied with a very accurate lateral dimension and height by evaporation coating. As far as the Inventors have been able to establish, this is even substantially independent of which structuring method is used.

Furthermore, the joining elements or frames can be produced at low cost as part of an assembly, e.g. at wafer level or in batches.

Furthermore, the process is very clean and therefore particularly suitable, for example for MEMS, in which case the frame may even be deposited by evaporation coating directly onto the substrate comprising the MEMS or other component.

The production of the frame, or the structuring of the glass layer, is advantageously carried out at low temperatures, so that, for example, resist masks are retained and can be removed again using a solvent, e.g. acetone. Therefore, the process is also suitable for temperature-sensitive substrates, e.g. plastic substrates or organic substrates.

Furthermore, the production of the joining element or the structuring of the glass layer is carried out without aggressive etching gases and/or liquids, with the result that it is also possible to use sensitive substrates.

In particular, the following techniques are suitable for joining the two substrates or for joining the second substrate to the frame or bonding frame: adhesive joining, soldering and/or bonding.

This clearly illustrates the extraordinary advantage of the invention. Not only is it extremely versatile with regard to the connection techniques which can be employed, but also it is possible for substrates to be, for example, anodically bonded by means of the joining element, even if the material of one or both substrates is not itself suitable for anodic bonding, e.g. alkali-free glass, such as AF45, AF37 or AF32 produced by SCHOTT Glas. If appropriate, a joining element is applied or evaporation-coated onto each of the two substrates.

A frame made from anodically bondable material, in particular comprising an alkali glass, is used for anodic bonding. This frame may, for example, be joined to the glass substrate by means of what is known as direct bonding on to the glass substrate using a bonding layer.

As an alternative to anodic bonding, other suitable processes include fusion bonding, sol-gel bonding and/or low-temperature bonding. The person skilled in the art is thoroughly familiar with these processes. Nevertheless, a further benefit of the invention is linked to the above, since the evaporation-coating material or material of the bonding frame can be matched to the desired bonding process irrespective of the substrate material. Therefore, substrates made from virtually any desired material can be combined using virtually any bonding process by means of the joining element(s), with the result that completely new application areas with a huge potential are opened up.

As an alternative or in addition, the surface of the frame is provided with a metallization and then alloy-soldered or soft-soldered. If appropriate, the bonding surface is activated.

By way of example, a wafer or chip made from a semiconductor material, e.g. silicon, made from an organic material, from glass, in particular a silicate or borosilicate glass, e.g. Borofloat 33, made from ceramic or made from metal, is used as material for the first and/or for the second substrate.

The frame is, in particular, continuous, e.g. a polygon formed from straight or curved webs, a circle or any other desired formation, and the second substrate is fixedly and permanently joined to the frame in a hermetically sealed manner. This results in hermetic encapsulation or housing of the regions inside the frame, with the first and second substrates being spaced apart from one another, in particular within the frame so that a void or cavity is formed. Therefore, at least a region inside the frame on the surface of the first substrate remains free of frame material. Alternatively, however, it is also possible to apply an open frame with interruptions in the webs in order to vent the cavity.

In particular, the thickness of the frame is matched to the particular application, with a cavity being formed between the two substrates. Evaporation-coating thicknesses in the range from 100 μm to 1 μm, preferably from 10 μm to 2 μm or 4 μm, have proven appropriate for the above mentioned applications. In principle, it is possible to achieve thicknesses of from 1 mm to 0.1 μm or 10 nm, and thicknesses of <10 μm or <3 μm are particularly preferred, although it is also possible to achieve thicknesses of <0.5 μm.

The width of the bonding surface may vary considerably, and is substantially limited only by the aspect ratio of the mask for the structuring process which can be achieved. Wide frames may have web widths of up to several millimeters or may even take up the entire surface of the substrate.

It is preferable for the frame to have a structure or web width of $\leqq 10$ mm, in particular $\leqq 1$ mm or $\leqq 100$ μm, particularly preferably from 1 μm to 500 μm. In the extreme scenarios of narrow frames, it is possible to achieve web widths of <100 nm or even of just a few tens of nm. Unlike with, for example, simple screen printing, there is no restriction imposed by grain sizes in the material.

According to the invention, the lift-off technique can also be used to produce good aspect ratios for microstructures/nanostructures, e.g. 3 μm/2 μm=3:2 using simple means. Consequently, it is possible to achieve aspect ratios of >1 or $\geqq 1.5$.

Therefore, with the process according to the invention, it is advantageously possible to produce very narrow yet nevertheless very thick or high frames, so that a sufficient distance is produced between the substrates combined, at the same time, with a lateral space saving.

Furthermore, the inventors have established that narrow frames can be bonded particularly well and with a good hermetic seal. On the other hand, it has been found that even a narrow frame or a glass frame with a web width of 5 μm or 10 μm up to 1000 μm forms an effective diffusion barrier for gases, moisture and aggressive media for hermetic housing, if appropriate with a controlled atmosphere.

By way of example, a MEMS, MOMS, MOEMS, and/or a semiconductor region of a silicon chip or wafer is arranged and housed or hermetically encapsulated in the cavity.

In addition, it is possible to provide that, within the frame, one or more supporting elements, e.g. supporting points or regions, be arranged on the first surface of the first substrate within the frame, this preferably being realized in the same process step as the production of the frame. The supporting elements and/or frames comprise continuous frame shapes, e.g. round, polygonal or oval, but also parts of frame shapes, e.g. lines, corners, rounded sections, points, and substantially act as spacers.

It is preferable for the upper plateau of the bonding frame, i.e. a surface of the evaporation-coating glass which extends substantially parallel in particular to the substrate surface, to serve as the bonding surface. In this case, the applied frame has the function of defining a predetermined distance between the first substrate and one or more second substrates.

As an alternative, it is also possible to produce an accurately predetermined angle of inclination during the mounting of the second substrate with respect to the first substrate by using a partial frame. An inclined design is advantageous, for example, for optical caps, known as "individual VCSEL packaging", in order to utilize partial reflection of the laser for the monitor diode. Therefore, in the joined state, the first and second substrates are in particular substantially parallel or inclined with respect to one another.

Furthermore, as an alternative, it is also possible for a side wall of the frame to be used as a bonding surface. Furthermore it is possible for non-planar surfaces to be coated with glass.

According to a particularly preferred refinement of the invention, a plurality of frames are nested inside one another. This increases the hermetic sealing and reliability by a multiple.

Furthermore, an adhesive for joining purposes can be introduced inside the frame or between the nested frames. Alternatively, a predetermined fluid, i.e. a predetermined gas which is not air, or a liquid and/or particles is/are introduced into the cavity and/or into the space between the nested frames before the first and second substrates are joined. The fluid can flow through the spaces or passages and may comprise a cooling liquid, a sensing liquid, a color filter and/or one or more reaction gases.

The frame preferably has a minimum thickness which ensures that the two substrates and/or components which are present thereon do not touch one another in the housed state.

According to a particularly preferred embodiment of the invention, interconnects, for example for the contact-connection of semiconductor elements, are arranged on one of the substrates, for example, the first substrate.

It is preferable for the glass layer in the form of the frame to be deposited by evaporation coating on the interconnects, so that the latter, at least in regions, are hermetically led through the frame or enclosed by the frame. It is preferable for a portion of the interconnects to remain clear on one or both sides of the web, to allow subsequent contact-connection. It is preferable for in each case one web or edge of the frame to be applied transversely with respect to the interconnects. After the frame has been joined to the second substrate therefore, the interconnects lead in a hermetically sealed manner into the cavity from the outside through the frame. The interconnects may run not only laterally but also vertically with respect to the first substrate and may, in this manner, extend through the joining element, so that it is possible to produce a laterally or vertically running electrical connection through the hermetic encapsulation.

If appropriate, the frame, after production on the first surface of the first substrate, or more specifically after application by evaporation coating, is planarized, in particular abrasively, by means of chemical-mechanical polishing or another suitable process. This advantageously compensates for unevenness caused by the thickness of the interconnects, therefore resulting in uniform bonding.

Furthermore, alignment elements or aids can be produced on the first surface or a second surface of the first substrate, with the second surface lying on the opposite side from the first surface. Alignment aids of this type, for example in the form of frames, points and/or lines, are advantageous for the alignment of lens systems or other optical or mechanical components.

Furthermore, it is preferable for a further joining element to be produced on the second surface of the first substrate, i.e. the back surface thereof, in order for a multiplicity of substrates to be joined to form a stack. This too is preferably carried out prior to the dicing and further increases the throughput.

In the text which follows, the invention is explained in more detail on the basis of exemplary embodiments and with reference to the drawings, in which identical and similar elements are provided with identical reference symbols and the features of the various exemplary embodiments can be combined with one another.

DETAILED DESCRIPTION OF THE INVENTION

Figure 1A:
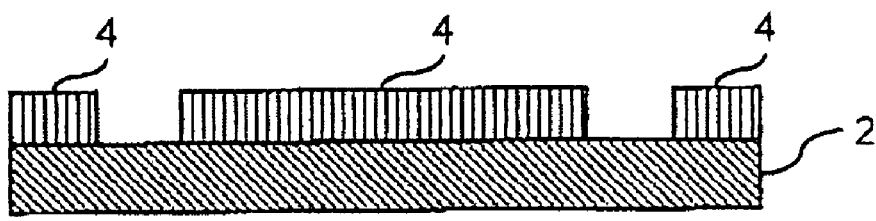
FIG. 1a-e show diagrammatic sectional illustrations of the production of a substrate assembly in various process stages in accordance with a first exemplary embodiment of the invention.

FIG. 1a shows a substrate 2 made from metal. Alternatively, the substrate 2 may also be a silicon, ceramic or glass substrate. A photoresist 4 has been applied to the substrate 2 using a process known to the person skilled in the art and patterned by photolithography. In this case, the layer of resist represents a mask which adheres securely to the substrate. Alternatively, it is also possible to use a shadow mask or covering mask which does not adhere securely.

Figure 1B:
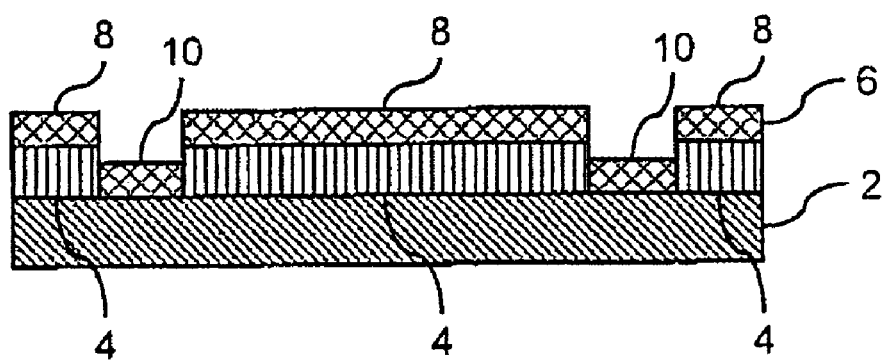

Then, referring to FIG. 1b, a continuous layer of glass 6 comprising the evaporation-coating glass 8329 is applied by evaporation coating to the substrate 2 and the photoresist 4.

Figure 1C:
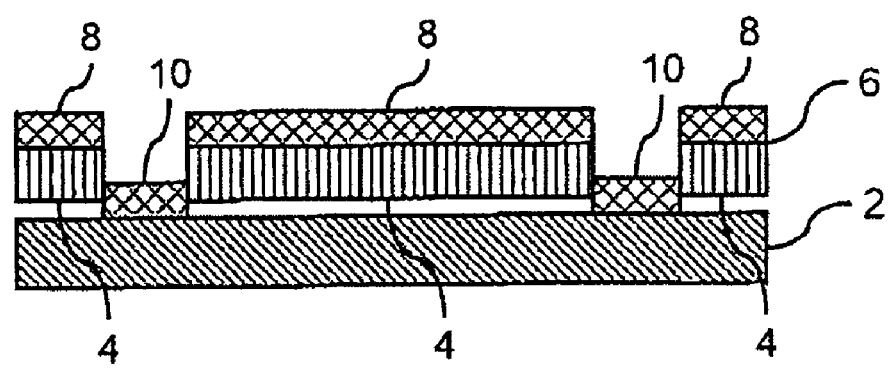

Referring now to FIG. 1c, the photoresist 4 together with the sections 8 of the glass layer 6 which are present thereon are removed by means of acetone. The sections 10 remain fixedly joined to the metal substrate 2. This process is known as the lift-off process and is one with which the person skilled in the art is familiar.

Figure 1D:
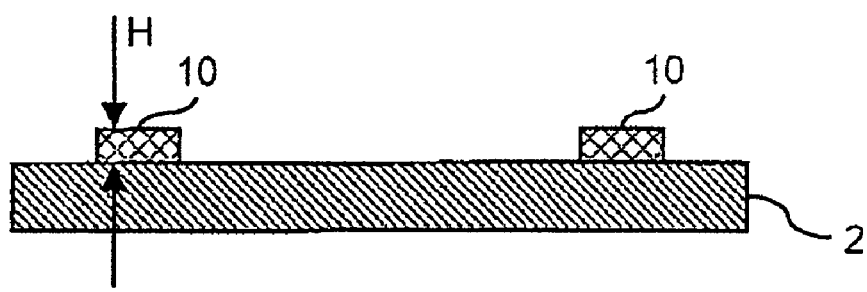

Referring now to FIG. 1d, what remains is the substrate 2 with a structured glass layer in the form of a bonding frame 10.

Figure 1E:
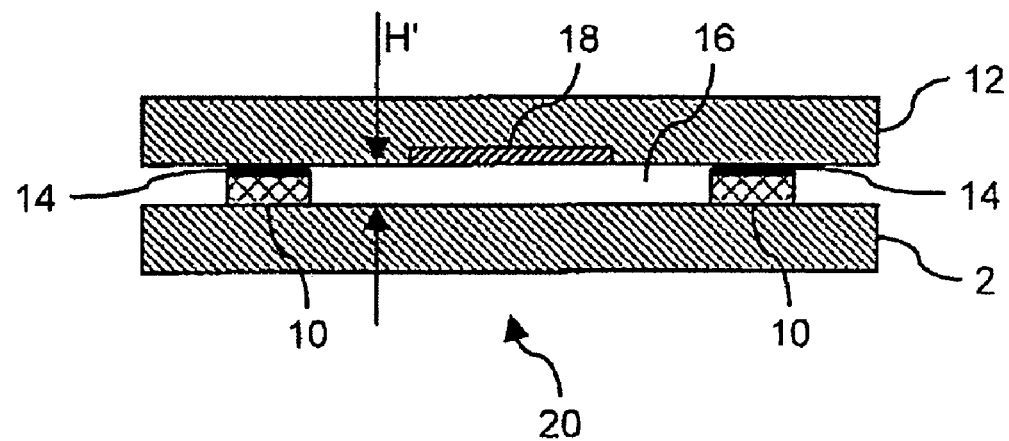

As illustrated in FIG. 1e, a covering substrate 12 made from silicon is anodically bonded to the bonding frame 10 in order to form a composite element 20, the bonding locations being denoted by 14. On account of the thickness or height H of the bonding frame 10, a cavity 16 with a height H', which is not significantly greater than H, is formed so that a semiconductor component 18 on the top substrate 12 is at a distance from the metal substrate 2.

Referring once again to FIG. 1b, the glass layer 6 is applied by means of electron beam evaporation. Although this process has been known for years, it has hitherto been used primarily for the mechanical and optical surface treatment of plastic or glass spectacle lenses, which only involved the application of areal layers.

High evaporation-coating rates of up to 4 µm/min, in particular >10 nm/min or >100 nm/min, are possible with the evaporation-coating glass 8329 (degassed Duran). Approximately 500 nm/min is particularly preferred. This exceeds, for example, sputtering rates by a multiple and makes the use of this process of huge interest for the application according to the invention. This is because sputtered layers comprising single-component systems, e.g. $SiO_2$, can only be applied with sputtering rates of a few nanometers per minute.

The following parameters are set in order for the continuous glass layer 6 to be applied to the metal substrate 2:

BIAS temperature during the evaporation: 100° C.

Pressure during the evaporation: $10^{-4}$ mbar

Furthermore, a metal substrate 2 with a surface roughness of <50 µm is used, and an evaporation-coating glass whose coefficient of thermal expansion (CTE) is matched to the metal substrate 2 and/or to the top substrate 12 in a moderately dila-thermal manner is selected. The CTE of the glass 8239 is 3.3 ppm/K, which approximately corresponds to the CTE of silicon.

Using intensive tests, the Inventors have discovered that the glasses 8329 or G018-189 produced by SCHOTT Glas are particularly suitable for coating metal by thermal or electron beam evaporation. These evaporation-coating glasses have an excellent resistance to solvents, moisture (85°, 85%, 1000 h) and temperature (T<Tg). Furthermore, the glasses have very good thermomechanical properties, even at low temperatures (<−100° C.), and consequently appear suitable for use for superconducting electronic components. On the other hand, the glasses also can be used at high temperatures (>300° C.) and therefore in particular also for power electronics such as power CMOS components.

Figure 2:
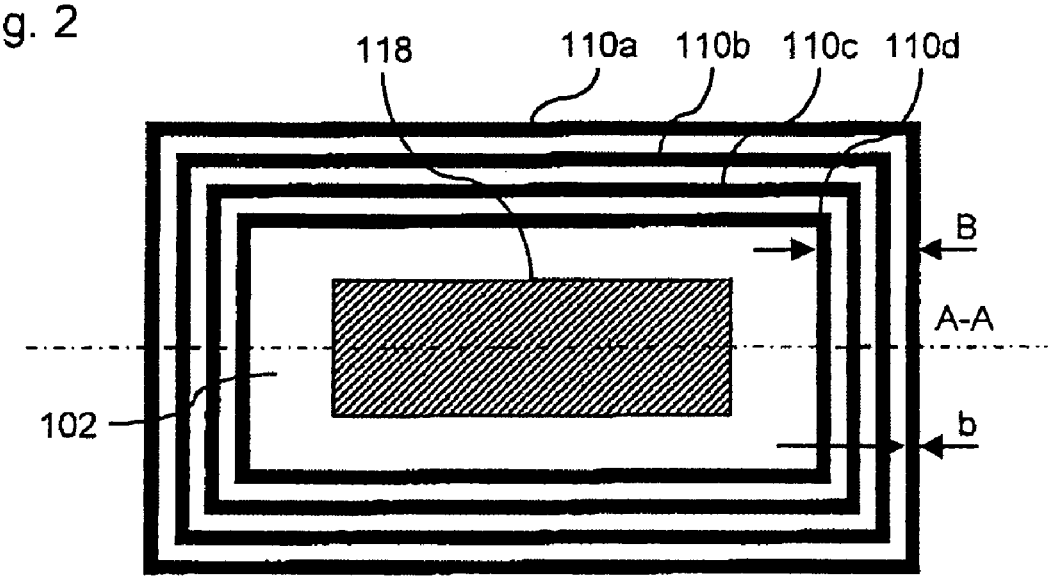
FIG. 2 shows a plan view of nested bonding frames on a substrate in accordance with a second exemplary embodiment of the invention.
Figure 3:
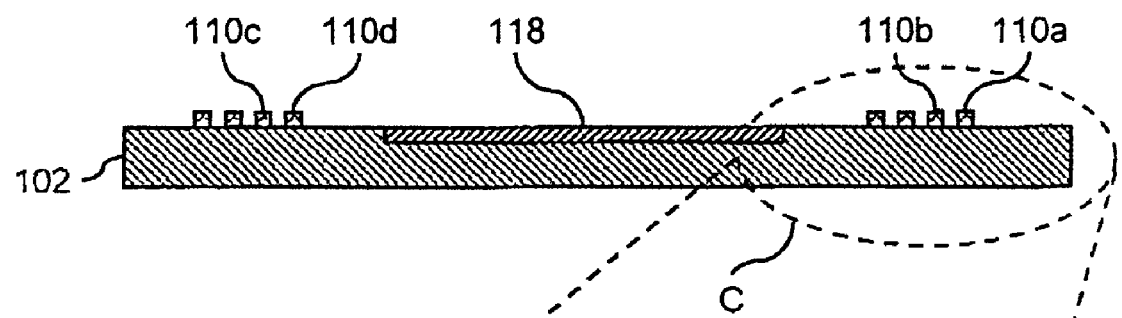
FIG. 3 shows a diagrammatic sectional illustration on line A-A in FIG. 2.

FIGS. 2 and 3 show an arrangement comprising four bonding frames 110a to 110d, nested inside one another, which delimit an electronic component 118 on a substrate 102.

Figure 4:
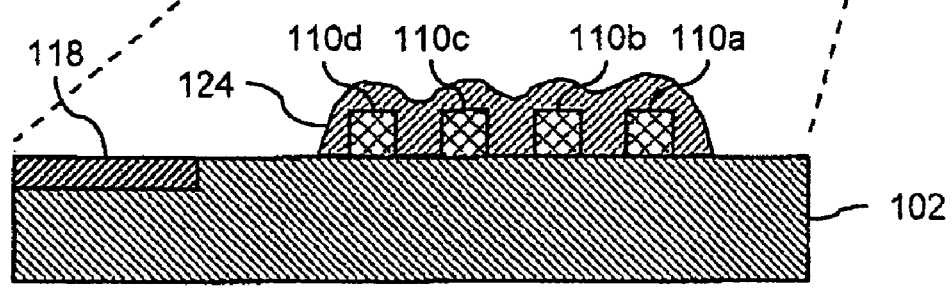
FIG. 4 shows an enlarged excerpt of region C in FIG. 3.

Referring now to FIG. 4, an epoxy adhesive 124 is applied in the region of the frames 110a to 110d, with the surface of the frames being covered with adhesive and the space between the frames being filled with adhesive. This increases the strength of the join. Furthermore, the frames accommodate the adhesive more successfully and simplify the adhesive joining process.

If appropriate, the adhesive is applied in vacuo, in order to improve the way in which the spaces suck in the adhesive. Furthermore, the plurality of frames serve as a crack stop to increase the mechanical load-bearing capacity of the composite element and to increase the reliability. In this case, the plurality of frames, in each case having a smaller web width b, is more lightweight and stable than a single, solid frame of the same total web width B.

Figure 5:
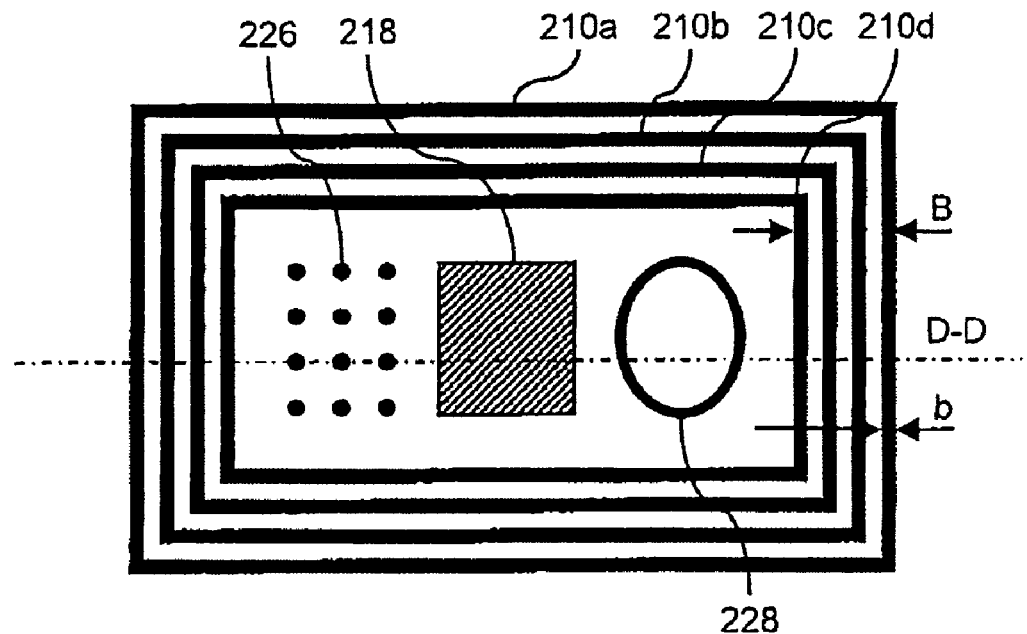
FIG. 5 shows a diagrammatic plan view of nested bonding frames on a substrate in accordance with a third exemplary embodiment of the invention.
Figure 6:
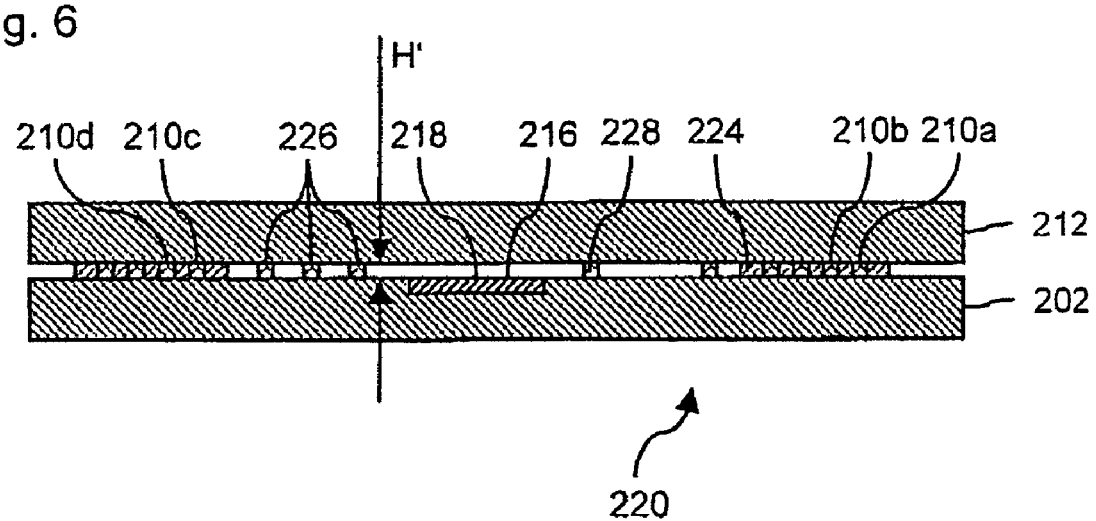
FIG. 6 shows a diagrammatic sectional illustration on line D-D in FIG. 5.

Referring now to FIG. 5, punctiform supporting elements 226 and a supporting frame 228 for supporting the top substrate 212 and for ensuring the cavity height H' in the region of the component 218 are arranged inside the bonding frames 210a to 210d.

The supporting elements 226 and the supporting frame 228 are not joined to the top substrate 212, but rather the latter merely rests loosely on them.

Referring now to FIGS. 7 and 8a to 8c, the following text explains an exemplary embodiment for micro-optical-electromechanical systems (MOEMS). A structured glass substrate 302 is used as top substrate to house image sensors as part of a wafer level packaging process. A cavity is required in the housing as a "spacer" and a "sealing element". The cavity allows, micro-optical elements, such as micro-lenses and/or micro-mirrors to function.

On account of the optical function of the glass substrate 302, conventional processes are not suitable for this application or are unable to offer an inexpensive solution. Although material-removing processes, such as etching, grinding, ultrasonic machining, sand blasting or pressing can in principle produce cavities, such processes would have an adverse effect on the high-quality optical inner surface of the substrate 302. Therefore, according to the invention, the bonding structure is applied by being built up.

Figure 9:
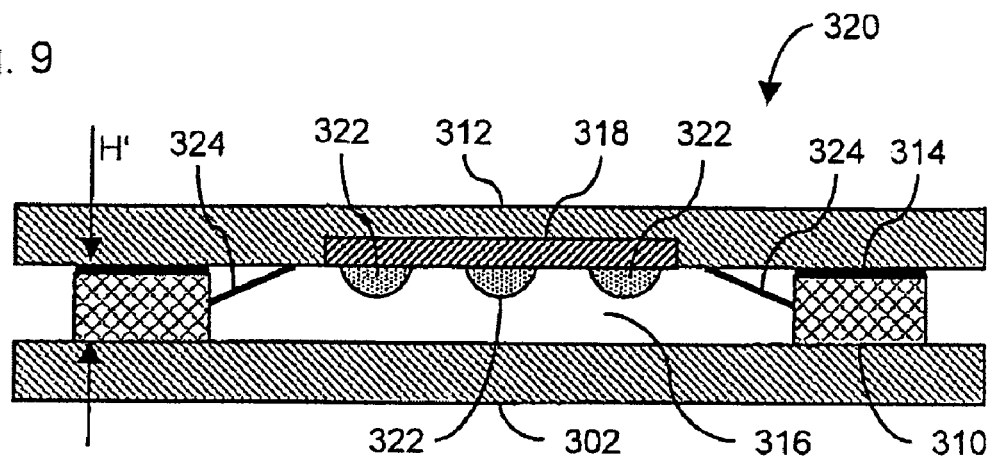
FIG. 9 shows a diagrammatic sectional illustration of an excerpt from the fourth exemplary embodiment after bonding.

FIG. 9 illustrates a silicate glass substrate 302 having a multiplicity of rectangular window sections 303, each window section 303 being completely covered with photoresist 304. The thermomechanical properties of the substrate 302 are matched to the second substrate 312, a silicon wafer, having an CMOS image sensor 318 (cf. FIG. 9). The substrate 302 is patterned using the evaporation-coating glass 8329 and is thereby provided with a large number of frames with a height of 5 μm. In this example, the substrate 302 is a polished Borofloat 33 wafer (CTE: 3.3 ppm/K) with a diameter of 150 mm and a thickness of 500 μm.

Figure 7:
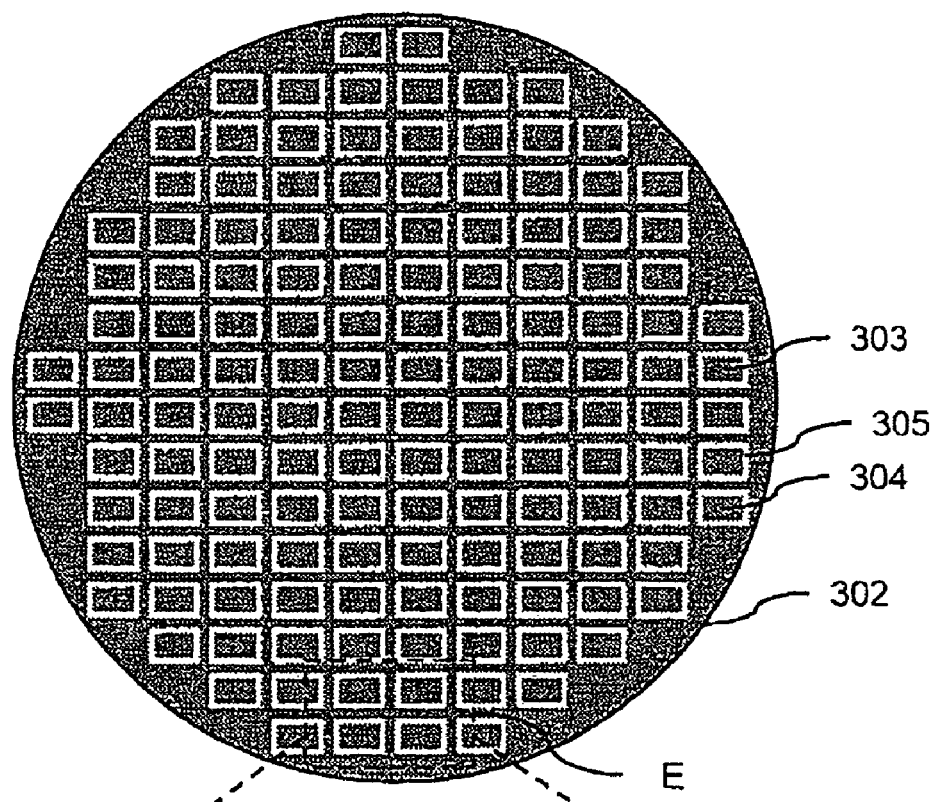
FIG. 7 shows a diagrammatic plan view of a wafer having a large number of bonding frames in accordance with a fourth exemplary embodiment of the invention.
Figure 8A:
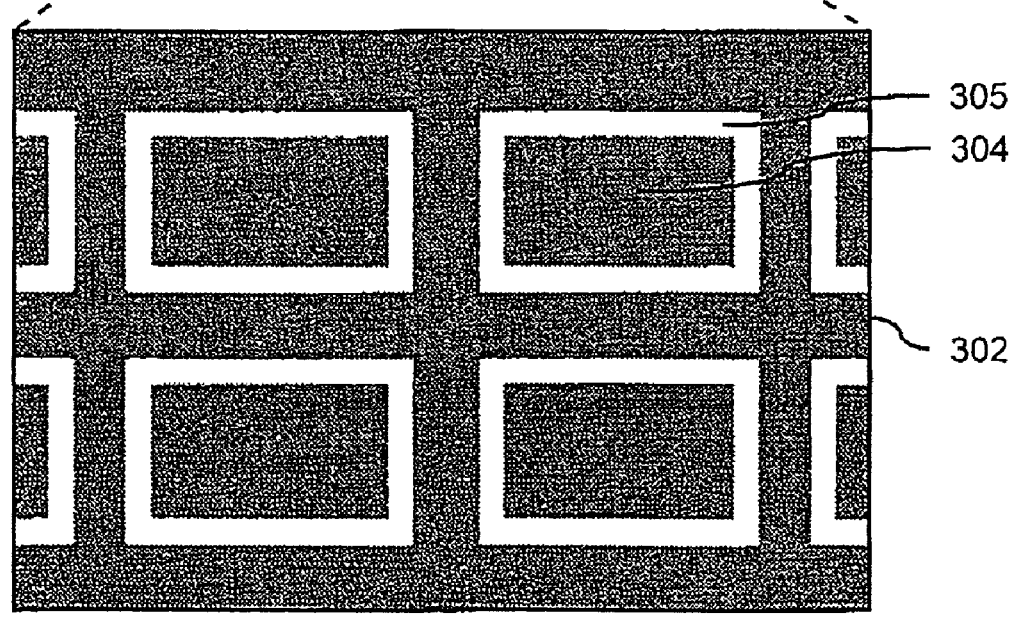
FIG. 8a shows an enlarged excerpt from region E in FIG. 7.

The photoresist 304 in FIGS. 7 and 8a has already been structured and has a rectangular recess 305 around each window section 303. The resist coating comprises, for example, AZ with a thickness of 10 μm, the photoresist being exposed and developed in what is known as a mask aligner and then being cured by means of what is known as "softcure". This allows a subsequent lift-off process, for example, in acetone.

Figure 8B:
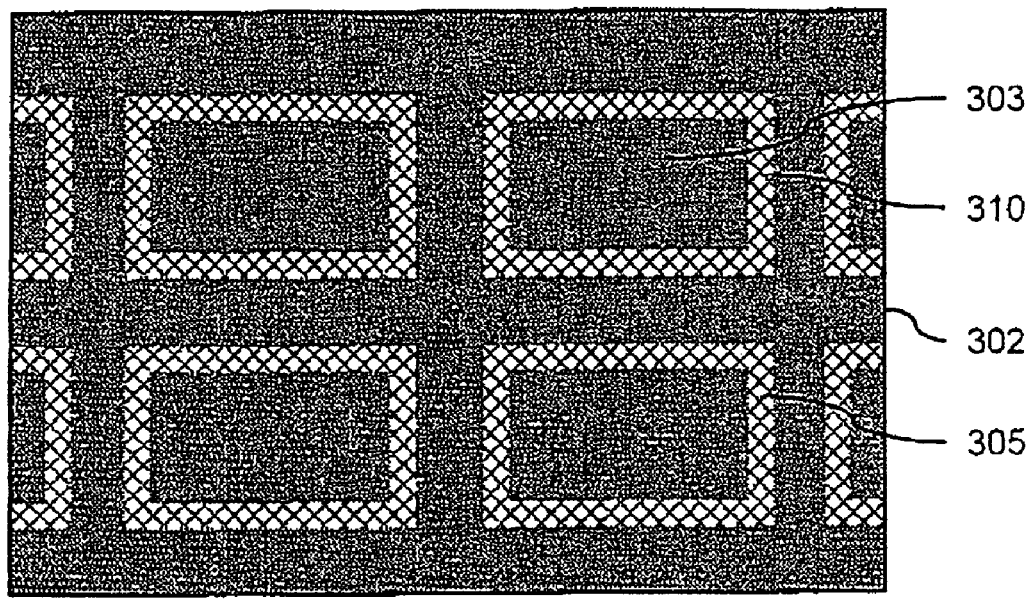
FIG. 8b shows the same as FIG. 8a, but with a glass layer which has been applied by evaporation coating.

FIG. 8b shows the wafer surface, which has been evaporation-coated with a layer of glass in a subsequent process step. The negative image which has been structured using photoresist has been evaporation-coated with a 5 μm thick glass layer formed from 8329 with a deposition rate of approximately 1 μm per minute. The subsequent surface or the window section 303 of the cavity is protected by the photoresist mask, so that the evaporation-coating glass in these regions cannot come into contact with the substrate 302 but rather is deposited on the photoresist mask. In the uncovered locations 305, the glass 8329 is deposited directly on the substrate 302.

Then, those regions of the deposited glass layer which are on the resist mask are removed by means of a lift-off technique. For this purpose, the photoresist is dissolved in acetone. The deposited glass in the regions 305 without photomask remains on the substrate 302 and forms the desired structure in the form of a matrix of bonding frames 310.

Figure 8C:
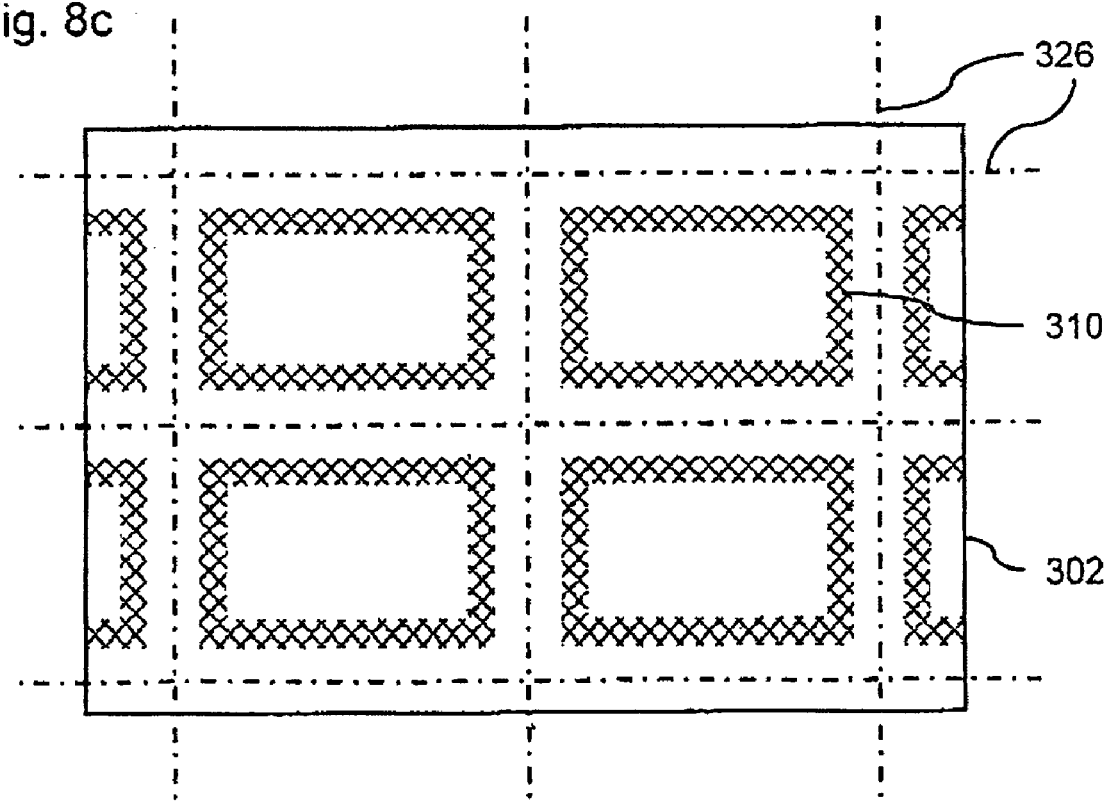
FIG. 8c shows the same as FIG. 8b, but following a lift-off step.

FIG. 8c shows the wafer excerpt following the lift-off process step.

Referring now to FIG. 9, the structured Borofloat 33 wafer 302 is then anodically bonded to a second substrate 312, which includes a multiplicity of image sensors 318. The result is therefore a multiplicity of opto-electronic composite elements 320 which are housed at wafer level.

Finally, the individual composite elements 320 are separated by dicing along sawing tracks 326. An individual composite element 320 of this type, having the opto-electronic component in the form of the image sensor 318 on a semiconductor substrate 312 is illustrated in section in FIG. 9.

Raised, passive optical components in the form of lenses 322 are arranged over the semiconductor substrate or the wafer 312 on the image sensor 318 and inside the hermetically enclosed cavity 316. Furthermore, two micro-mirrors 324, which may be movable, are arranged in the cavity 316.

The transparent Borofloat 33 substrate 302 is anodically bonded by means of bonding locations 314 to the bonding frame 310, the height H of which, at 5 μm, is greater than the height of the optical components 322 and 324. The result is a hermetically sealed, at least partially transparent housing with a cavity height of likewise approximately 5 μm for the image sensor 318, the micro-lenses 322 and micro-mirrors 324.

On account of the process according to the invention, the optical function of the substrate glass 302 in the region of the cavity 316 remains substantially unimpaired.

The frames produced in accordance with the invention have the further advantage that the sawing track 326 required for the dicing can remain clear.

Furthermore, the following variations are possible:

If the substrate 302 is to be joined to a further glass substrate, for example for alloy-soldering or for anodic bonding, a bonding layer is applied prior to the lift-off process step. For this purpose, a metal layer as bonding layer is deposited by means of physical vapor deposition. (PVD) or chemical vapor deposition (CVD), or a polysilicon bonding layer is deposited by means of CVD. In this way the bonding layer is structured during the lift-off process in a working step together with the frame 310.

The anodic bonding can be carried out in a controlled atmosphere with a predetermined gas composition and a predetermined pressure, in particular in the case of hermetic bonding, so that the cavities 316 have a controlled and predetermined atmosphere.

Furthermore, gases, biological and/or sensor liquids, and/or particles, can be enclosed in the cavities 316.

Figure 10:
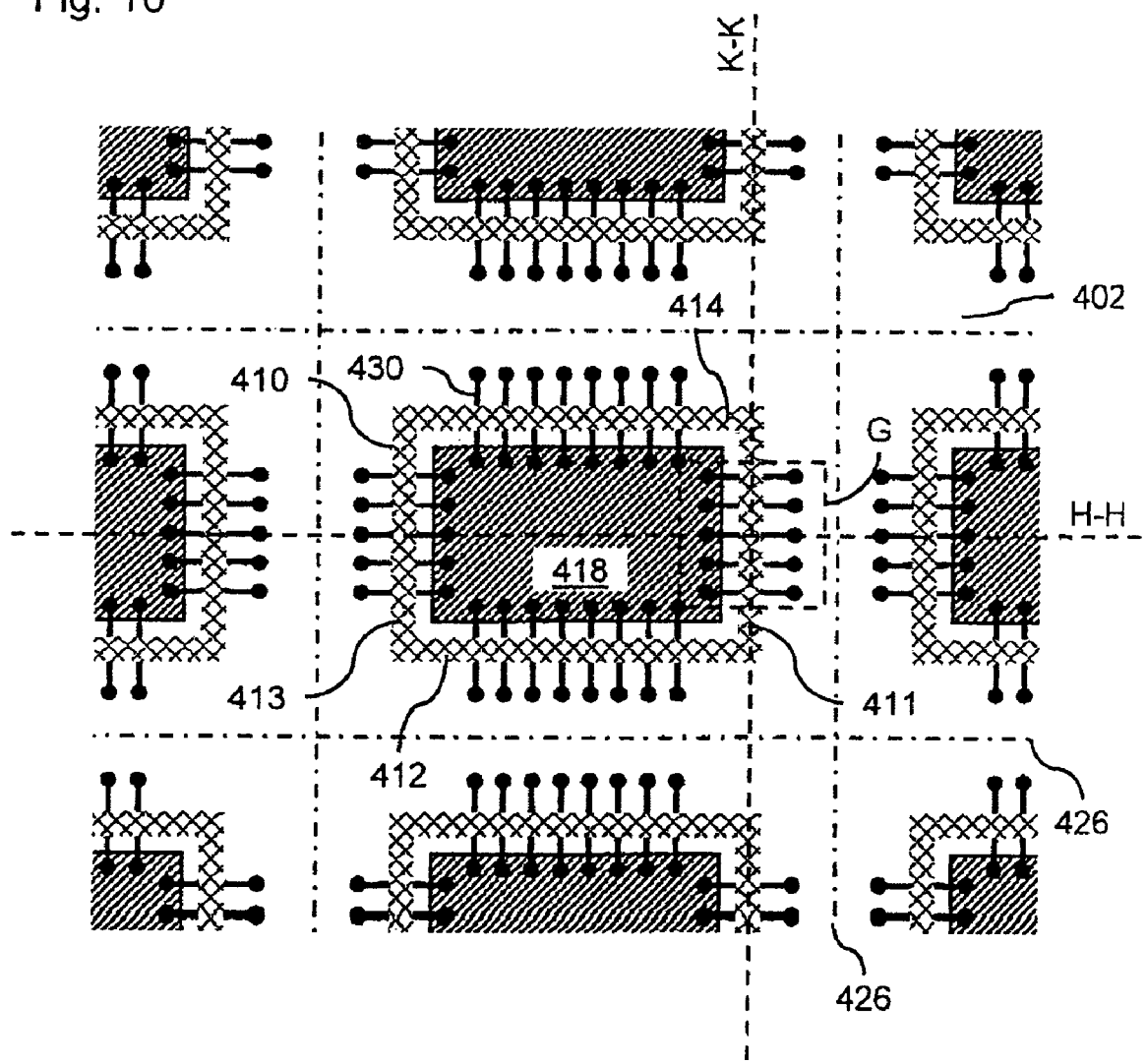
FIG. 10 shows a diagrammatic plan view of an excerpt from a wafer with interconnects which have been covered by evaporation coating in accordance with a fifth exemplary embodiment of the invention.

FIG. 10 illustrates an excerpt from a silicon wafer 402 having a multiplicity of semiconductor regions 418. The semiconductor regions 418 are contact-connected by interconnects 430. A bonding frame 410 has in each case been applied by evaporation coating over the aluminum interconnects belonging to a semiconductor region, by means of the process according to the invention corresponding to the steps illustrated in FIG. 1a to 1d. Alternatively, the interconnects may comprise gold, tungsten or titanium-tungsten. The webs 411 to 414 which form the rectangular bonding frame 410, are arranged transversely over the interconnects 430.

In this way, it is possible in particular for the bonding or glass frame 410 which has been applied by evaporation coating to cover structures which cannot be anodically bonded, such as the interconnects 430 on a substrate 402. The result is hermetically sealed coverage, in particular with a hermetically sealed leadthrough for the interconnects 430 to pass through. After joining to a top substrate and dicing along the saw lines 426, a multiplicity of hermetically encapsulated chips with outer contacts result.

Figure 11:
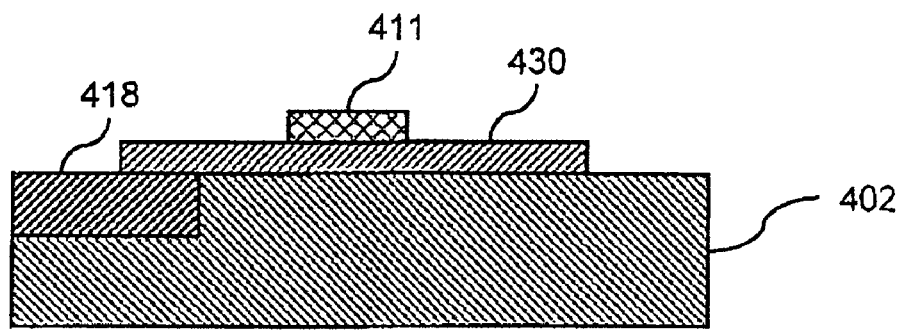
FIG. 11 shows an enlarged excerpt of region G in FIG. 10 in the form of a sectional illustration on line H-H.

FIG. 11 shows an enlarged excerpt of region G in FIG. 10, in the form of a sectional illustration on line H-H.

Figure 12A:
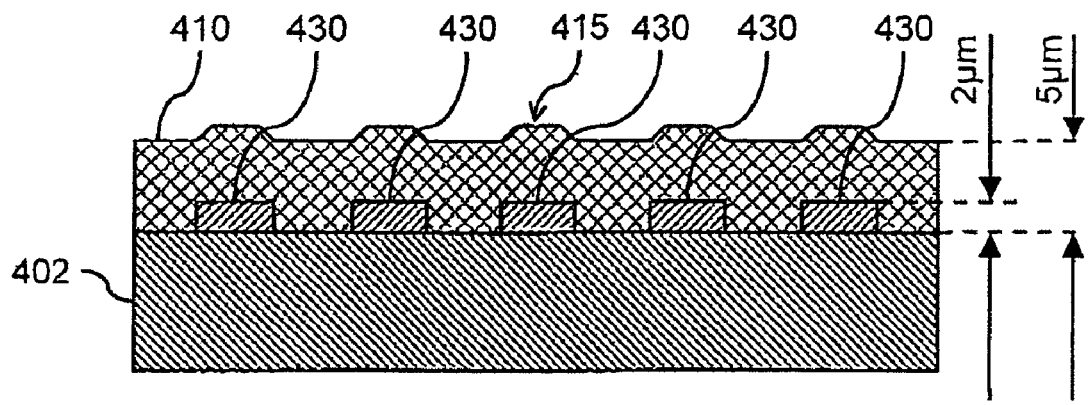
FIG. 12a shows an enlarged excerpt of region G in FIG. 10 in the form of a sectional illustration on line K-K.

FIG. 12a shows an enlarged excerpt of region G in FIG. 10, in the form of a sectional illustration on line K-K prior to joining to the top substrate. In this example, the interconnects 430 have a relatively great thickness or height of 2 μm and run transversely with respect to the plane of the drawing. The thickness of the interconnects 430 led to the formation of an uneven plateau surface 415 of the bonding frame 410 during the evaporation coating.

Figure 12B:
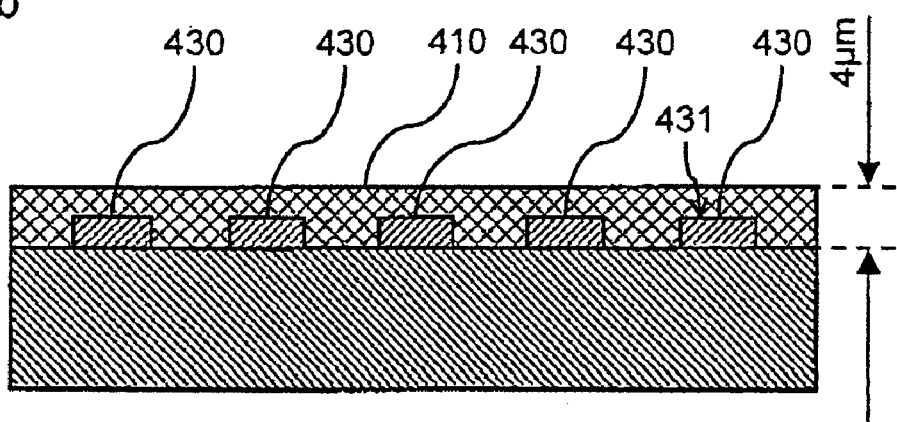
FIG. 12b shows the same as FIG. 12a after a planarization step.
Figure 13:
FIG. 13 shows eight examples of shapes of the bonding frame.
Figure 13:
Figure 13:
Figure 13:
Figure 13:
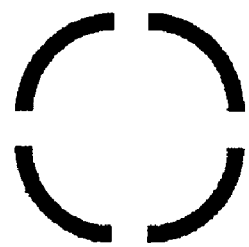
Figure 13:
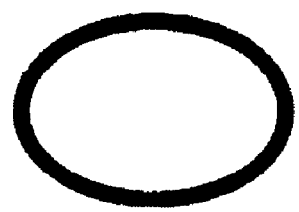
Figure 13:
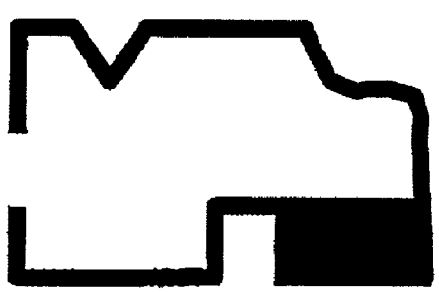
Figure 13:
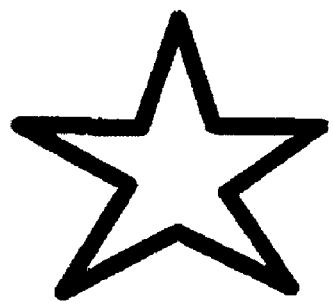

Referring now to FIG. 12b, to compensate for the relatively extensive topography and to produce a suitable planar bonding frame plateau surface 415, the latter is planarized by means of a CMP process. Furthermore, it can also at the same time be significantly thinned, for example from 5 μm to 4 μm. A corresponding procedure can also be adopted for any other nonplanar substrate. Furthermore, it is conceivable for the bonding frame to be abraded to beyond the surface 431 of the interconnects 430, so that the interconnects 430 can be contact-connected from above (not shown).

Given a lower thickness of the interconnects, typically of 400 nm, it is if appropriate possible to dispense with a planarization step.

If an anodically bondable glass, such as in this example 8329, is used for covering purposes, the frame can in turn be anodically bonded to a top substrate.

The following text provides results from various tests carried out on glass layers formed from glass 8329 which have been deposited by evaporation coating.

Figure 14:
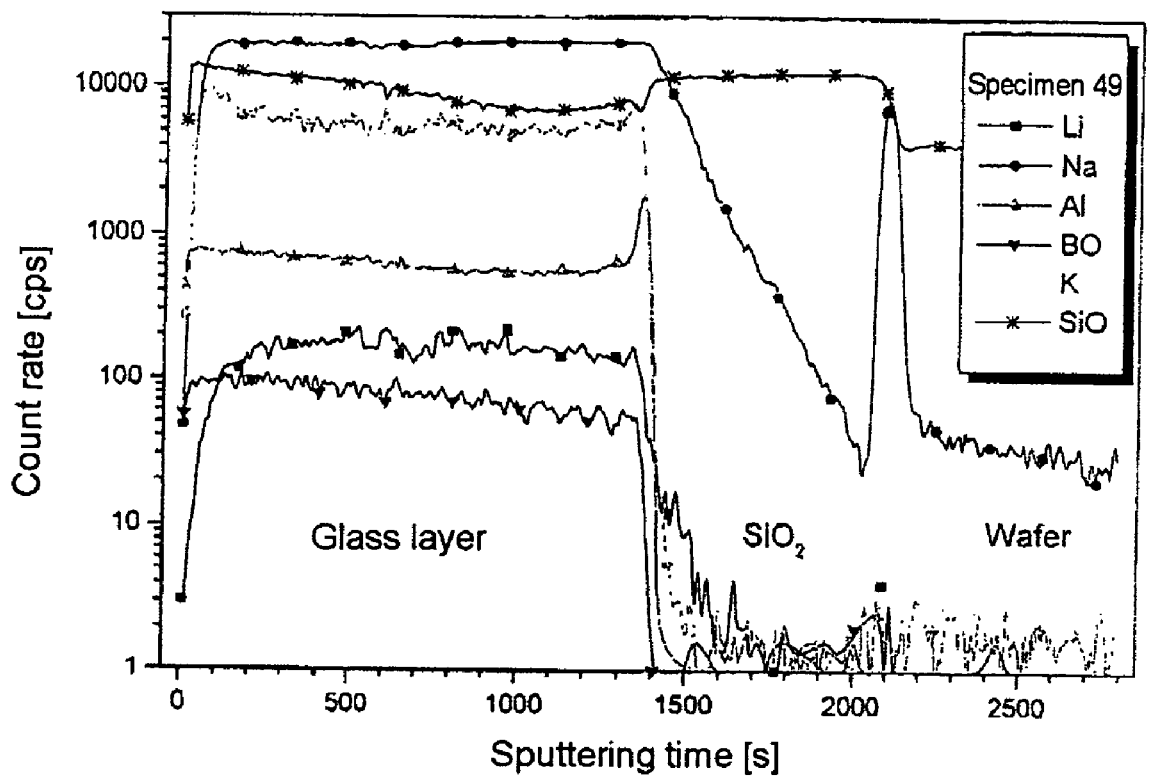
FIG. 14 shows results of a TOF-SIMS measurement.

FIG. 14 shows the results of a TOF-SIMS measurement, in which the count rate is plotted as a function of the sputtering time. The measurement characterizes the profile of the element concentrations of the glass frame. A thickness constancy for the glass frame of <1% of the layer thickness was determined.

Figure 15:
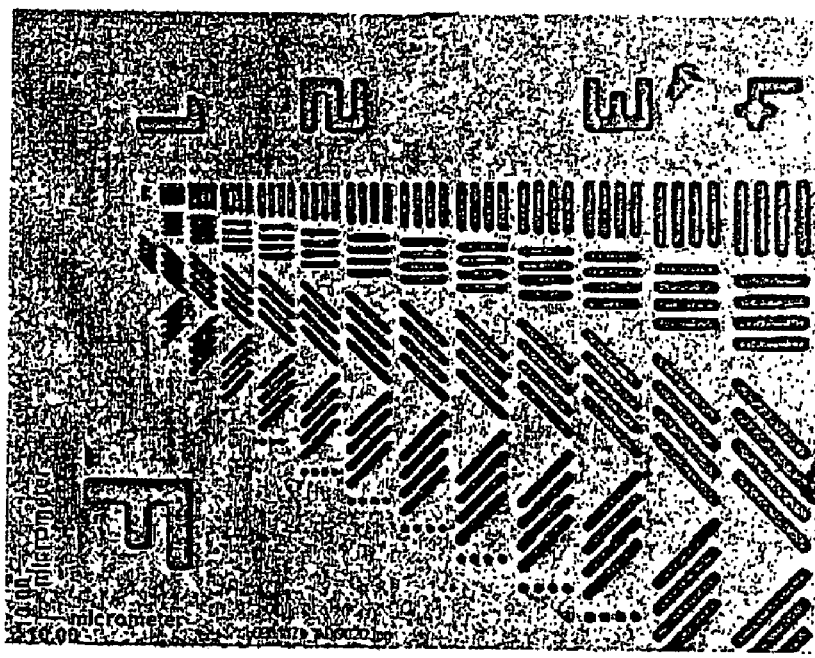
FIG. 15 shows a photo-microscope image of structured glass layers.

FIG. 15 illustrates photoresist-structured glass structures formed from glass 8329 which have been deposited by evaporation coating following the lift-off step.

Figure 16:
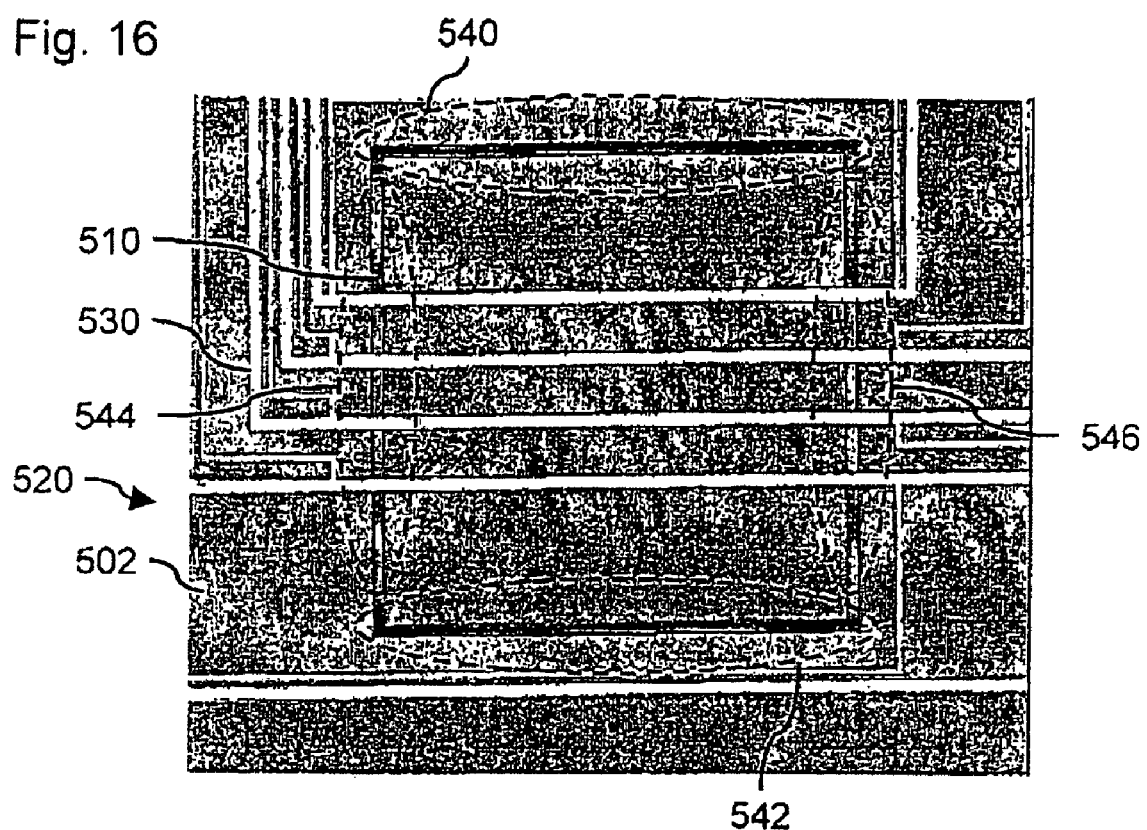
FIG. 16 shows a photo-microscope image of a sixth exemplary embodiment of the invention.

FIG. 16 shows a composite element 520 having a Borofloat 33 substrate 502 and interconnects 530 and a glass frame 510 evaporation-coated over them, similar to the fifth exemplary embodiment.

The thickness of the interconnects 530 is 200 nm, and the thickness of the glass frame 510 is 4 μm. In this sixth exemplary embodiment, the top substrate has been anodically bonded on without a planarization step.

It is clearly apparent that a bonded join is present only in the regions 540 and 542 whereas it was impossible to produce a bonded join in the regions 544 and 546 in the vicinity of the interconnects 530. The lack of bonding is indeed attributable to the unevenness of the surface or plateau face of the glass frame 510 caused by the interconnects.

Figure 17:
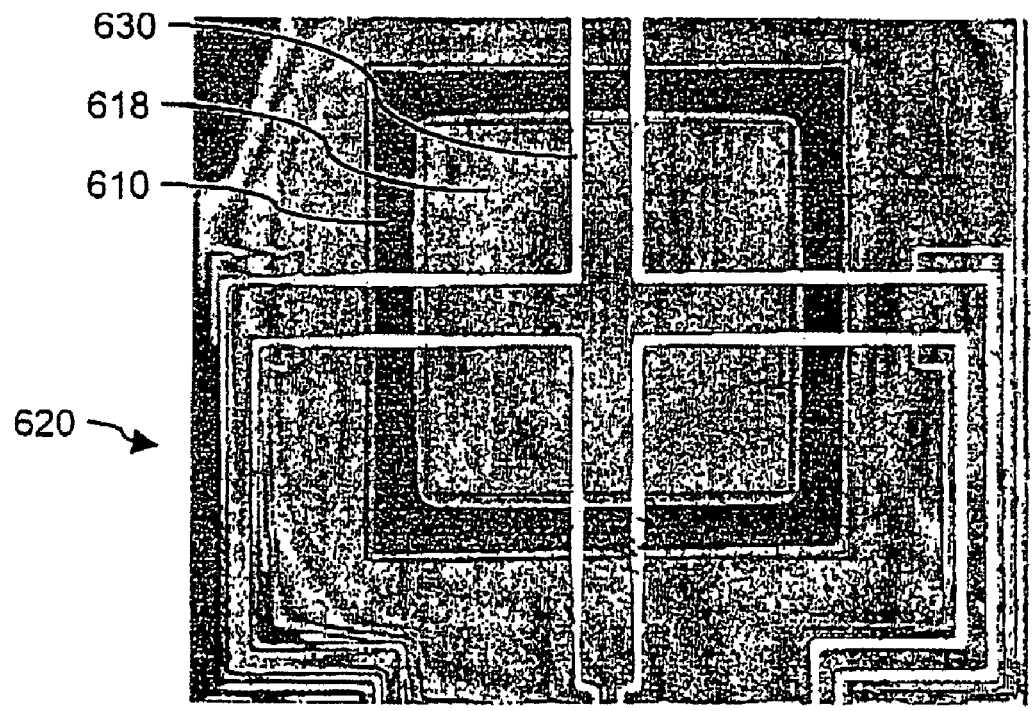
FIG. 17 shows a photo-microscope image of a seventh exemplary embodiment of the invention, and FIG. 18 diagrammatically depicts a wafer with perforated mask for a leak tightness test.

FIG. 17 shows a composite element 620 which is of similar structure to the composite element 520. In the case of the composite element 620, the glass frame 610 was planarized prior to the anodic bonding. The glass frame 610 was applied by evaporation coating with a thickness of 4 μm and then polished down to a thickness of approximately 2 μm. The thickness of the interconnects 630 is likewise 200 nm.

It is clearly apparent that the entire surface of the glass frame 610 is bonded, with the result that a hermetic closure of the cavity 616 was formed. The glass frame 610 has a web width of 300 μm and a size of 3 mm×3 mm.

Furthermore, leak tightness tests were carried out on the glass layer 8329 as follows.

Figure 18:
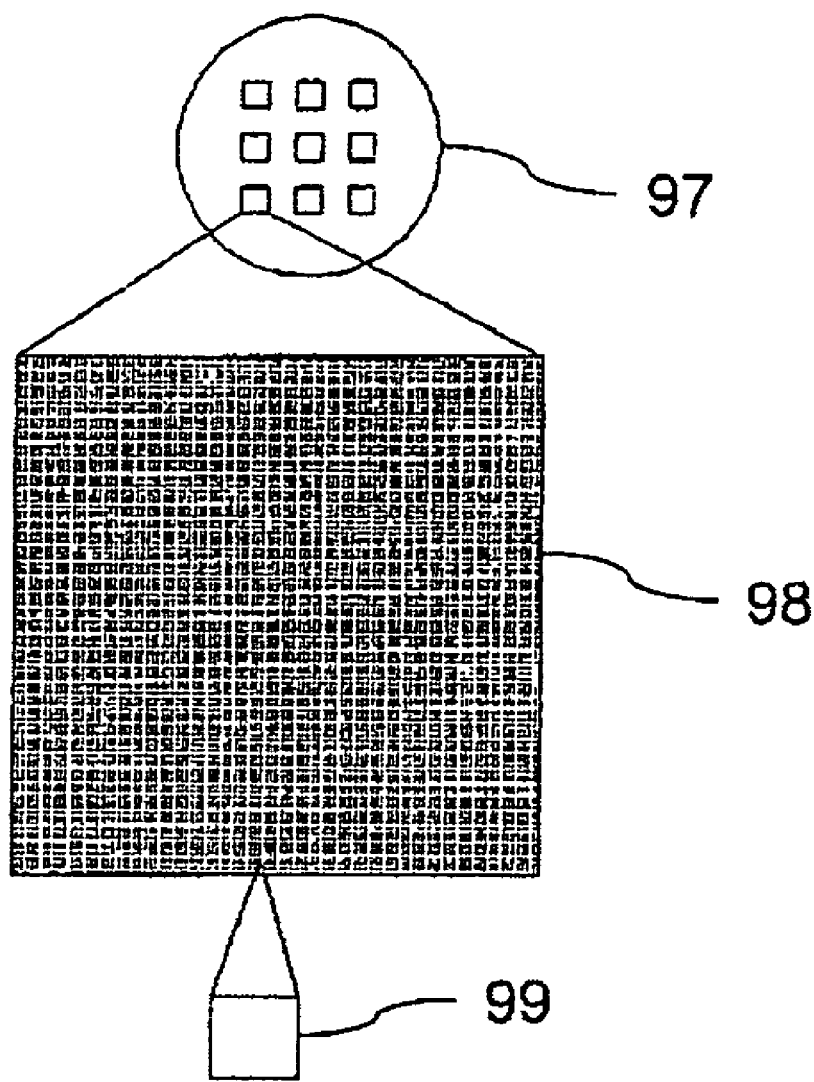

A silicon wafer was provided with an etching stop mask. As illustrated in FIG. 18, the wafer 97 was divided into nine perforated areas 98 (1 cm×1 cm). The individual spacing between the holes within the areas was varied from row to row as follows.

1st row: hole spacing 1 mm
2nd row: hole spacing 0.5 mm
3rd row: hole spacing 0.2 mm.

All the square holes 99 had an edge length of 15 μm.

After the unstructured backsurface of the wafer had been coated with an 8 μm (specimen A) or 18 μm (specimen B) layer of the glass 8329, the wafer was then dry-etched as far as the glass in the perforated areas. The success of the etching was easy to observe under a transmitted light microscope.

It is possible to achieve leak rates of at least $<10^{-7}$ mbar l/sec. For this exemplary embodiment, a helium leak measurement revealed a leak rate of $<10^{-8}$ mbar l/sec through the glass layer and therefore for the hermetic cavity.

The high strength of the glass layer regions despite considerable bulging of the wafer during the measurement in the respective measurement area is also amazing. There was no change in the glass structure even after conditioning at 200° C.

Furthermore, resistance and stability measurements were carried out on the glass frame in accordance with DIN/ISO. The results are given in Table 1.

TABLE 1

| Specimen designation: 8329 | | | |
|---|---|---|---|
| Water DIN ISO 719 class | Consumption of HCl [ml/g] | $Na_2O$ equivalent [μg/g] | Comments |
| HGB 1 | 0.011 | 3 | none |
| Acid DIN 12116 class | Material removal [mg/dm$^2$] | Total surface area [cm$^2$] | Comments/visible changes |
| 1 W as material | 0.4 | 2 × 40 | Unchanged |
| Alkali DIN ISO 695 class | Material removal [mg/dm$^2$] | Total surface area [cm$^2$] | Comments/visible changes |
| A2 as material | 122 | 2 × 14 | Unchanged |

It will be clear to the person skilled in the art that the embodiments described above are to be understood as examples and that the invention is not restricted to these embodiments, but rather can be varied in numerous ways without departing from the scope of the invention.

The invention claimed is:

1. A process for joining at least two substrates having electrical, semiconducting, mechanical and/or optical components, comprising the steps of:
   providing a first substrate;
   producing a joining element in the form of a frame on a first surface of the first substrate, the frame being made of a material selected from the group consisting of a binary system of materials, a glass, and a vitreous material, and the material being applied by evaporation coating, wherein the step of producing the joining element comprises structuring the joining element by a lift-off technique comprising patterning a photoresist-layer, applying the material by evaporation coating, dissolving the photoresist-layer to remove the evaporated layer thereon;

providing a second substrate; and joining the first and second substrates by the joining element.

2. The process as claimed in claim 1, wherein the joining element is deposited on the first surface of the first substrate and is joined to the first substrate while it is being deposited.

3. The process as claimed in claim 1, wherein the joining element is applied to the first surface of the first substrate by evaporation coating.

4. The process as claimed in claim 1, further comprising producing one or more supporting elements inside the joining element on the first surface of the first substrate.

5. The process as claimed in claim 1, further comprising applying a plurality of nested frames by evaporation coating as the joining element.

6. The process as claimed in claim 1, wherein the step of producing the joining element comprises deposition of a binary material system by evaporation coating.

7. The process as claimed in claim 1, further comprising applying and structuring a glass layer by evaporation coating through a mask to form the joining element.

8. The process as claimed in claim 1, wherein the joining element and the second substrate are joined by a joint selected from the group consisting of an adhesive joint, a soldered joint, and a bonded joint.

9. The process as claimed in claim 1, wherein the joining element and the second substrate are joined by a joint selected from the group consisting of an anodic bond, a fusion bond, a sol-gel bond, and a low-temperature bond.

10. The process as claimed in claim 1, wherein the first and second substrates comprise a first and second wafer, respectively, and wherein the process further comprises producing a multiplicity of laterally adjacent joining elements on the first surface of the first wafer, and after the first and second wafers have been joined to form a wafer assembly, dicing the wafer assembly into individual chips.

11. The process as claimed in claim 1, further comprising forming a cavity between the first and second substrates and inside the frame.

12. The process as claimed in claim 1, further comprising arranging interconnects on the first surface of the first substrate, and applying the joining element to the first surface by evaporation coating in such a manner that the interconnects are at least partially covered.

13. The process as claimed in claim 12, wherein the interconnects extend laterally or vertically through the joining element.

14. The process as claimed in claim 1, further comprising planarizing the joining element after it has been produced on the first surface of the first substrate.

15. The process as claimed in claim 1, further comprising producing alignment elements on the first surface or a second surface of the first substrate, the second surface being on the opposite side from the first surface.

16. The process as claimed in claim 1, further comprising joining a multiplicity of substrates to form a stack.

17. A process for joining substrates having electrical or optical components, comprising:

providing a first substrate and a second substrate;

in a first step, applying a frame to at least one surface of the first substrate, glass being used as material for the frame and the glass being applied by evaporation coating, wherein the step of applying the frame comprises structuring a glass layer by a lift-off technique comprising patterning a photoresist-layer, applying the material by evaporation coating, and dissolving the photoresist-layer to remove the evaporated layer thereon; and in a second, subsequent step, joining or bonding a surface of the second substrate to the frame so that a cavity is formed between the first and second substrates and inside the frame.

18. A process for joining at least two substrates having electrical, semiconducting, mechanical and/or optical components, comprising the steps of:

providing a first substrate;

producing a plurality of nested frame joining elements on a first surface of the first substrate, said plurality of nested frame joining elements being nested inside one another;

providing a second substrate; and joining the first and second substrates by the plurality of nested frame joining elements.

19. A composite element having electrical, electronic, semiconducting, mechanical and/or optical components, comprising:

a first substrate;

a joining element on a first surface of the first substrate;

a second substrate, the first and second substrates being joined by the joining element; and a plurality of nested frames being provided as the joining element, said plurality of nested frame joining elements being nested inside one another.

* * * * *